(12) United States Patent
Saneyoshi et al.

(10) Patent No.: US 11,486,915 B2
(45) Date of Patent: Nov. 1, 2022

(54) STATE ESTIMATION APPARATUS, METHOD, AND PROGRAM

(71) Applicant: NEC Corporation, Tokyo (JP)

(72) Inventors: Eisuke Saneyoshi, Tokyo (JP); Shigeru Koumoto, Tokyo (JP); Akira Shoujiguchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 351 days.

(21) Appl. No.: 16/629,650

(22) PCT Filed: Jul. 17, 2018

(86) PCT No.: PCT/JP2018/026746
§ 371 (c)(1),
(2) Date: Jan. 9, 2020

(87) PCT Pub. No.: WO2019/017345
PCT Pub. Date: Jan. 24, 2019

(65) Prior Publication Data
US 2020/0166552 A1    May 28, 2020

(30) Foreign Application Priority Data

Jul. 18, 2017  (JP) .............................. JP2017-139086

(51) Int. Cl.
*G01R 19/25*    (2006.01)
(52) U.S. Cl.
CPC ................................ *G01R 19/2513* (2013.01)

(58) Field of Classification Search
CPC .... G01R 19/2513; G01R 19/25; G01R 19/00; G01R 21/133; G01R 21/00; G01M 99/00
See application file for complete search history.

(56) References Cited

U.S. PATENT DOCUMENTS

| 8,405,339 B2 * | 3/2013 | Zhang | G01R 31/343 |
| | | | 700/286 |
| 2003/0042861 A1 * | 3/2003 | Schwartz | H02P 29/02 |
| | | | 318/434 |
| 2006/0226846 A1 | 10/2006 | Yasukawa et al. | |
| 2013/0311113 A1 * | 11/2013 | Basu | G01R 31/343 |
| | | | 702/58 |
| 2019/0339161 A1 | 11/2019 | Taguchi et al. | |

FOREIGN PATENT DOCUMENTS

| JP | H06-222117 A | 8/1994 |
| JP | H06-95059 B2 | 11/1994 |
| JP | H07-56608 A | 3/1995 |

(Continued)

OTHER PUBLICATIONS

International Search Report for PCT Application No. PCT/JP2018/026746, dated Oct. 16, 2018.

(Continued)

*Primary Examiner* — Mohamed Charioui
(74) *Attorney, Agent, or Firm* — Sughrue Mion, PLLC

(57) ABSTRACT

A state estimation apparatus is configured to extract a time interval to be analyzed from a time series of a first signal based on a second signal acquired in conjunction with the first signal relating to the operation of the facility, and estimate a change in a state of the facility based on waveform data of the time interval of the first signal.

7 Claims, 14 Drawing Sheets

(56) References Cited

FOREIGN PATENT DOCUMENTS

| | | | |
|---|---|---|---|
| JP | 2001-012245 A | | 1/2001 |
| JP | 2006-266844 A | | 10/2006 |
| JP | 2013-044736 A | | 3/2013 |
| JP | 2015-021901 A | | 2/2015 |
| JP | 2015021901 A | * | 2/2015 |
| JP | 2016-057102 A | | 4/2016 |
| JP | 2016-173782 A | | 9/2016 |
| JP | 6144404 B1 | | 6/2017 |
| WO | 2013/157031 A1 | | 10/2013 |

OTHER PUBLICATIONS

Shigeru Koumoto, Takahiro Toizumi, and Eisuke Saneyoshi, "Electricity Fingerprint Analysis Technology for Monitoring Power Consumption and Usage Situations of Multiple Devices by Using One Sensor," pp. 92-95/NEC Technical Journal/vol. 68, No. 2(Feb. 2016)/Special Issue on NEC's Smart Energy Solutions Led by ICT, Japan.

\* cited by examiner

STATE ESTIMATION APPARATUS, METHOD, AND PROGRAM

REFERENCE TO RELATED APPLICATION

This application is a National Stage Entry of PCT/JP2018/026746 filed on Jul. 17, 2018, which claims priority from Japanese Patent Application 2017-139086 filed on Jul. 18, 2017, the contents of all of which are incorporated herein by reference, in their entirety.

FIELD

The present invention relates to an apparatus, method, and program that estimate the state of equipment.

BACKGROUND

Deterioration state of an electric facility or an electric device (abbreviated to "facility") progresses with time and year in dependence on usage thereof. As a typical cause of the deterioration, there is electro-migration (EM). When corrosion of a wiring pattern on a circuit board occurs due to EM, there is a case where quality of a power supply line and signal transmission line deteriorates and eventually it becomes difficult to perform normal power supply and signal transmission, thus leading to an end of a product's life. Further, depending on a usage mode or usage environment of a facility, the facility may be broken before it reaches its lifespan.

In a facility that performs heat exchange, such as a refrigeration facility and an air conditioning facility, a compressor compresses a refrigerant gas to generate a high-temperature and high-pressure gas, which is subjected to heat exchange with an outside air by a condenser (outdoor heat exchanger). An expansion valve decompresses the refrigerant gas which is partially liquefied by the condenser. In an evaporator, the refrigerant gas absorbs heat in a room and changes from a liquid to a vapor. The refrigerant gas output from the evaporator returns to the compressor again. There is generally provided a filter at an inlet of a condenser (outdoor heat exchanger) of each of these air conditioning facilities, so that dust does not enter inside. In addition to deterioration/failure of an electric circuit or a rotating machinery provided in the facility, for example, an amount of air inflow and outflow may be decreased, for example, by a clogged filter or the like, as a result of which malfunction or failure of the facility may occur.

In order to prevent sudden failure of the facility, for example, regular maintenance is performed. However, in the regular maintenance, a maintenance interval (maintenance period) depends also on a usage mode and a usage environment of a maintenance target facility. For this reason, it is difficult to set an appropriate interval of regular maintenance. For instance, a short regular maintenance interval may incur an increase in a maintenance cost, while a long regular maintenance may incur a safety problem.

Therefore, there is a case wherein a technique is used that monitors a state of a facility by a management apparatus using a sensor (for instance ammeter, voltmeter, wattmeter, temperature sensor, pressure sensor, vibration sensor, etc.) and predicts or estimates a deterioration state of the facility to determine whether or not maintenance is necessary.

For example, the following related technologies are known as a technology that monitor a state of a facility by installing a sensor in the facility to be monitored.

Patent Literature 1 discloses an operation status determination apparatus capable of determining an operation status of an electric facility with high accuracy even if a voltage waveform applied to the electric facility changes. The operation status determination apparatus acquires learning data that associates waveform data of a harmonic current included in a current flowing through a power supply line, operation status information indicating the operation status of the electric facility when the waveform data is generated, and a section specifying information that specifies a preset waveform data comparison target section in one cycle of the AC voltage applied to the electric facility with each other. The operation status determination apparatus determines the operation status of the electric facility based on a result of collating, in the waveform data comparison target section, the waveform data of the harmonic current associated with the acquired learning data and waveform data of the harmonic current measured by a harmonic current measuring part.

Patent Literature 2 discloses a device identification apparatus and device identification method enabling a user to appropriately register a device and an operation mode thereof. That is, Patent Literature 2 discloses a device identification apparatus connected to a wattmeter for measuring a current waveform of one or more power-consuming electric devices and identifying an operation mode of the electric device from the current waveform. This device identification apparatus includes a measurement control part that controls the wattmeter to start and stop of measurement of a current waveform of the electric device, a measurement input part that receives the current waveform measured during a measurement period from the start to the stop, a waveform pattern extraction part that extracts one or more waveform patterns from the current waveform received, a pattern identification part that classifies, according to each operation mode, one or more waveform patterns that are extracted, a registration part that registers the operation mode of the classified waveform pattern, and an instruction part that instructs the measurement control part to start and stop the measurement of the current waveform and instructs the registration part to register the operation mode of the waveform pattern.

Further, for example, the following related technologies are known as technologies for predicting a change in a state of a facility with time.

Patent Literature 3 discloses a technology for enabling optimization without being affected by a change over time component of an actual result value used for optimization and for enabling prediction of near-future change. That is, a near-future behavior of a processing process of a simulation target is predicted by defining a variance as an evaluation function used to evaluate an output predicted from a simulation model and an actual result value obtained from an actual processing process for input information given under a predetermined processing condition, and by correcting an change over time component of the actual result value with extracted change over time information after correcting a variation (variance or standard deviation) of a model error.

Further, for example, Non-Patent Literature 1 discloses a related technology that determines an individual state of each of a plurality of electric devices using a single sensor. Power consumption of each device is estimated and an operating state of the device is determined by obtaining a waveform of a current (for example, an instantaneous waveform for each cycle) flowing in a main line using one current sensor which is attached to a distribution board and analyzing the waveform by referring to a waveform database in which current waveform information unique to each device is stored.

Patent Literature 1:
Japanese Patent Kokai Publication No. JP2013-044736A
Patent Literature 2:
International Publication No. WO2013/157031
Patent Literature 3:
Japanese Patent Kokai Publication No. JP-H07-056608A
Non Patent Literature 1:
Shigeru Koumoto, Takahiro Toizumi, and Eisuke Saneyoshi, "Electricity Fingerprint Analysis Technology for Monitoring Power Consumption and Usage Situations of Multiple Devices by Using One Sensor," NEC Technical Journal/Vol. 68, No. 2/Special Issue on NEC's Smart Energy Solutions Led by ICT

SUMMARY

Detecting or estimating a deterioration state of a facility by using, for example, a wattmeter, as a sensor for sensing a state of the facility may cause an accuracy problem. In some cases, as described later, depending on a facility, a change over time (deterioration) appears as a significant difference in a power value only when deterioration has progressed considerably and the facility has failed or is almost in a failure state. In this case, it is difficult to appropriately estimate change over time in a state of facility with practical accuracy by monitoring a power value. In addition, appropriately detecting the deterioration state of facility based on electric power information requires high-performance wattmeter and calculation processing.

Patent Literature 1 discloses the operation status determination apparatus capable of determining an operation status of an electric facility with high accuracy. However, this technology still requires high-performance voltage and current measurement for estimation of a change over time in a state of the facility.

Further, when the state of the facility is estimated from time-series data of a current consumed by the facility and a deterioration state of the facility is detected or estimated, the current value of the facility may vary due to a variation in an AC voltage applied, also causing a state of the facility to be varied. In this case, it becomes difficult to accurately estimate a deterioration state and a change over time of the facility.

The present invention was devised in view of the above problems, and it is an object thereof to provide a state estimation apparatus, method, and program, each enabling estimation of a temporal change in a state of a facility with a practical accuracy while suppressing an increase in cost.

According to the present invention, there is provided a state estimation apparatus comprising:
a processor; and a memory storing a program executable by the processor, wherein the processor is configured to
extract a time interval to be analyzed from a time series of a first signal based on a second signal acquired in conjunction with the first signal relating to an operation of a facility; and
estimate a change in a state of the facility based on waveform data of the time interval of the first signal.

According to the present invention, there is provided a state estimation method that estimates a state of a facility by a computer, the method comprising:

extracting a time interval to be analyzed from a time series of a first signal based on a second signal acquired in conjunction with the first signal relating to an operation of a facility; and
estimating a change in a state of the facility based on waveform data of the time interval of the first signal.

According to the present invention, there is provided a program causing a computer to execute processing comprising:
extracting a time interval to be analyzed from a time series of a first signal based on a second signal acquired in conjunction with the first signal relating to an operation of a facility; and
estimating a change in a state of the facility based on waveform data of the time interval of the first signal.

According to the present invention, there is provided a computer-readable recording medium storing the program (for example, a semiconductor storage such as RAM (Random Access Memory), ROM (Read Only Memory), EEPROM (Electrically Erasable and Programmable ROM), etc., and a non-transitory computer-readable recording medium such as HDD (Hard Disk Drive), CD (Compact Disc), DVD (Digital Versatile Disc), etc.).

According to the present invention, it is made possible to estimate a change over time in a state of a facility with practical accuracy while suppressing an increase in cost.

DETAILED DESCRIPTION

Figure 1:
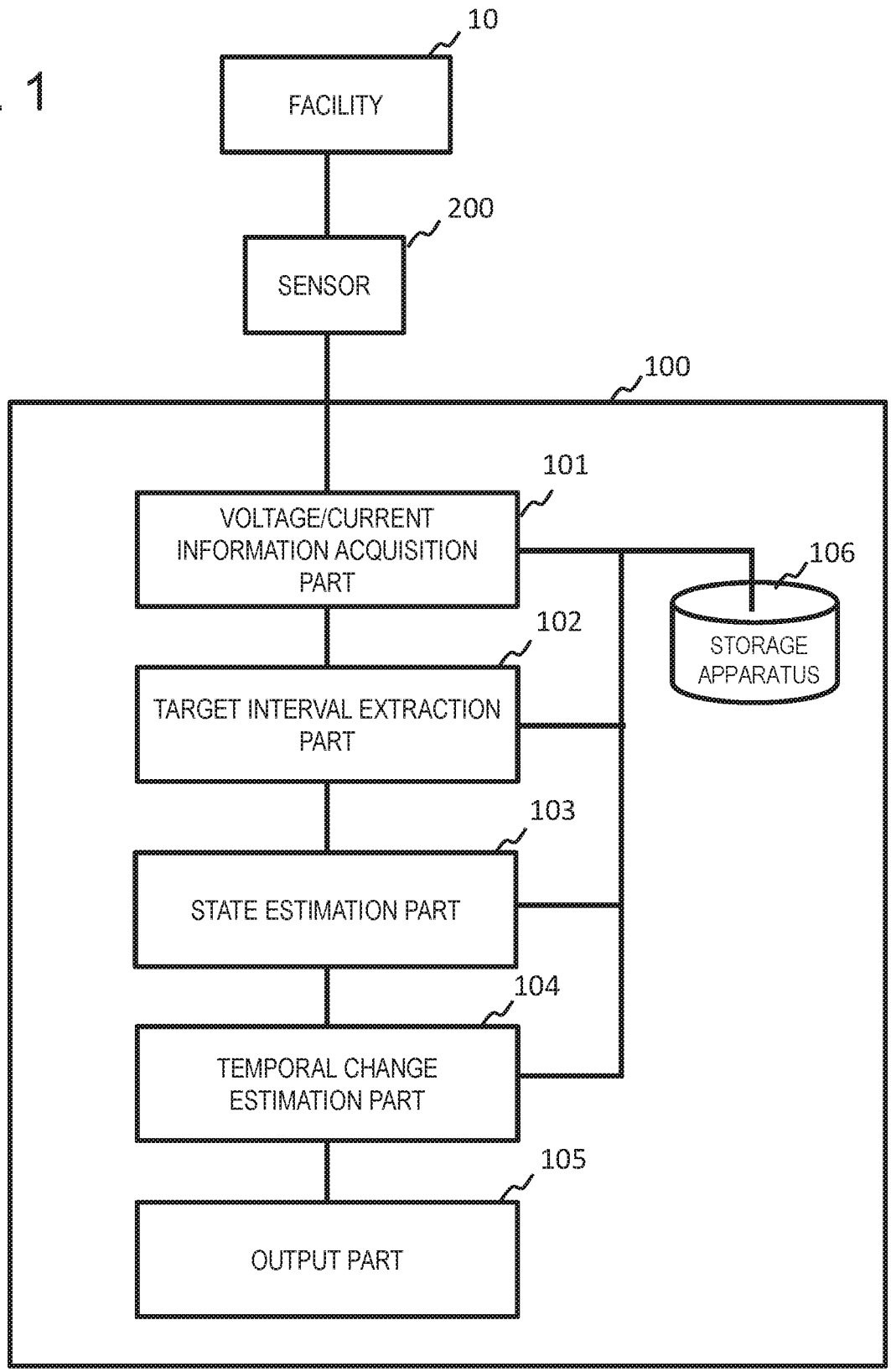
FIG. 1 is a diagram illustrating a configuration example of an example embodiment of the present invention. (Partially changed.)

According to a mode of the present invention, a processor (for example, 111 in FIG. 10) provided with a communication interface that communicatively connects to a sensor, and a memory, executes a first process (first means, unit) that extracts a time interval, within which an analysis is to be performed, on a time series of a first signal (for example, a current flowing through the facility) relating to an operation of the facility, based on a second signal (for example, a voltage applied to the facility) acquired in conjunction with the first signal, and a second process (second means, unit) that estimates a temporal change in a state of the facility, based on waveform data of the first signal (for example, current waveform data) in the time interval.

The first process (first means, unit) may select the time interval of the first signal as an analysis target, when the second signal corresponding to a certain time interval on the time series of the first signal is at a predetermined value or in a predetermined state.

The first process (first means, unit) may remove a time interval which is excluded as an analysis target, from time-series data of the first signal, based on the second signal.

The first process (first means, unit) may exclude a time interval corresponding to an operating mode which is not affected by a temporal change (change over time) from the time-series data of the first signal. At this time, the first process may exclude a time interval corresponding to an operating mode unaffected by a temporal change (change over time) from the time-series data of the first signal based on operation history information of the facility.

The second process (second means, unit) may estimate a change in a state of the facility from waveform data of the first signal (current) of the facility corresponding to the time interval, apply a filtering process which corresponds to a time constant of a temporal change to be extracted, on the change in the state, and estimate a temporal change in the state of the facility.

The second process (second means, unit) may acquire time-series data of a risk of failure of the facility, based on the time-series data of the first signal (current) of the facility corresponding to the time interval, apply a filtering process which corresponds to a time constant of a temporal change to be extracted, on the time-series data of the risk of failure corresponding to the time interval, and estimate a temporal change in the state of the facility.

According to the present invention, it becomes possible to accurately estimate a state change, i.e., a change over time in a state of a facility by extracting a time interval of the current corresponding to a specified effective value regarding an AC voltage applied to the facility and estimating the state of the facility from current waveform data of the extracted time interval. As a result, according to the present invention, it becomes possible to estimate a temporal change in the state of facility with a practical accuracy while suppressing an increase in cost. The following describes example embodiments with reference to the drawings.

Example Embodiment

FIG. 1 is a diagram illustrating an example embodiment of the present invention. With reference to FIG. 1, according to an example embodiment of the present invention, a state estimation apparatus 100 that estimates a state of a facility includes a voltage/current information acquisition part 101, a target interval extraction part 102, a state estimation part 103, a temporal change estimation part 104, an output part 105, and a storage apparatus 106.

Note that the target interval extraction part 102 may correspond to the first means that executes the first process. The state estimation part 103 and the temporal change estimation part 104 may correspond to the second means that executing the second process.

The voltage/current information acquisition part 101 acquires time-series data of an AC voltage applied to a facility 10 and time-series data of an AC current flowing through the facility 10, from a sensor 200, and stores the data in the storage apparatus 106.

The voltage/current information acquisition part 101 may include, for example, a communication means (communication unit 101-1 in FIG. 2A) and acquire time-series data (digital waveform data) of voltage/current of the facility 10 measured by the sensor 200 by communicating with the sensor 200 (FIG. 2A) via the communication means. Alternatively, the voltage/current information acquisition part 101 may include a communication means (a communication unit 101-1 in FIG. 3A) and acquire current information of an individual facility by acquiring voltage information and a composite current waveform relating to a plurality of the facilities 10 from the sensor 200 connected to the main line of a distribution board (22 in FIG. 3A), and using a disaggregation technology. Alternatively, a smart meter (23 in FIG. 3A) installed in a building, such as a house, factory or store may be utilized as the sensor 200, and the voltage/current information acquisition part 101 may acquire information on measured voltage and current values from the smart meter and separate electric current information of an individual facility, using a disaggregation technology.

In the sensor 200, a sampling rate of an AC voltage applied to the facility 10 and a current flowing through the facility 10 (current dissipated by the facility 10) may or may not be the same. Preferably, a sampled waveform of the AC voltage which is applied to the facility and a sampled waveform of the current may be held in association with the sampling time. When the sampling frequency of the sensor 200 is known, a sampling time of the sampled waveform of voltage/current having a predetermined time length does not need to be held for each sampled value, and only sampling start time information of the sampled waveform may be held.

For instance, the sensor 200 may provide the voltage/current information acquisition part 101 with time-series data of voltage/current sampled at a predetermined sampling frequency (for example, 20 KHz (Kilo Hertz)) from the sampling start time along with the sampling start time information (T1). The voltage/current information acquisition part 101 may store the time-series data of voltage/current transmitted from the sensor 200 in the storage apparatus 106 in association with the sampling start time information.

The voltage/current information acquisition part 101 may adjust a phase difference (Ø: power factor angle) from the voltage waveform based on, for example, a zero cross point of the AC voltage waveform data, and then divide the time-series data of the current waveform into a plurality of cycles of a commercial AC power supply.

The target interval extraction part 102 extracts a time interval (s) to be analyzed for the time-series data of the current information acquired by the voltage/current information acquisition part 101 and stored in the storage apparatus 106, based on the voltage information. For example, a time interval may be one cycle (20 ms (millisecond)) or a plurality of cycles of the commercial power supply. The target interval extraction part 102 may exclude a time interval (s) which is not an estimation target of a temporal change in a state.

Generally, when environmental conditions (temperature, humidity, atmospheric pressure, etc.) are constant, current information can be determined according to a voltage supplied to the facility. This is more true, when, for example, a feedback operation for causing the facility to reach an operation target value is not performed (for example, current information can be determined mostly in accordance with a voltage).

For example, the target interval extraction part 102 may extract a time interval(s) out of waveform data of the voltage applied to the facility, wherein a voltage waveform of one cycle of the commercial AC power supply within the time interval, belongs to a specific state. The specific state include, for example, a state in which a statistical value of the voltage (maximum value, mean value, variance, etc.) is at a certain numerical value, or within a certain range, or a state in which it can be determined that a relationship (correlation function, correlation coefficient, covariance, etc.) between the voltage waveform and a preset reference waveform matches a predetermined relationship.

Figure 5:
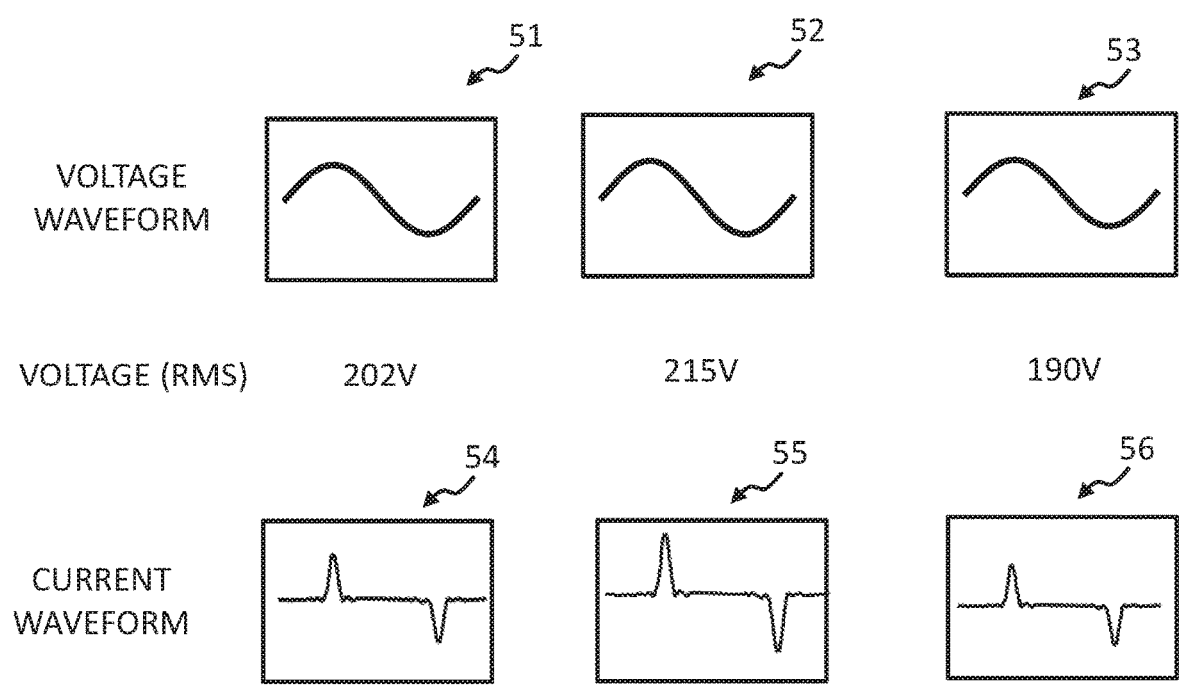
FIG. 5 is a diagram illustrating an example embodiment of the present invention.

The target interval extraction part 102 may select a time interval(s) in time series of sampled values of a current, in which the voltage takes an identical (same) value. FIG. 5 schematically shows a current waveform for one cycle (54, 55, 56) when an RMS (root mean squared) value of the AC voltage is 202V, 215V, and 190V (voltage waveforms 51, 52, 53; note that an allowable electric voltage is, for example, 202V±20V). As for the RMS values of the AC voltage 202V, 212V, or 192V, it may be a mean value of the RMS values of the AC voltage during a predetermined measurement interval (for example, one hour). For instance, a time interval in which the RMS value of the AC voltage is 202V may be selected as a state estimation target. The target interval extraction part 102 extracts a time interval(s) of current corresponding to a selected time interval(s) as a time interval(s) to be analyzed.

The target interval extraction part 102 may extract a sampling time (period), as a time interval within which a state estimation is to be carried out, when the RMS value of the AC voltage during the time (period) corresponding to the sampling time (period) is 202V (or 202 V±α) in the time-series data of the current. In FIG. 5, time intervals nay be extracted similarly for the AC voltage effective values 215V and 190V.

Further, an extracted time interval of the current to be analyzed may be equal to or less than the AC voltage measurement period (for example, one hour), or the time interval may be in the order of one cycle to several tens of cycles of the commercial power frequency. In a case where aging over year, over a long period of time is to be monitored, representative sample values may be extracted. Conversely, when a temporal change in a state of facility within a short period of time (for example, one hour) is to be analyzed, an extracted time interval of the current to be analyzed may be approximately equal to an AC voltage measurement period (for example, one hour).

The state estimation part 103 estimates a state of a facility based on information (for example, a feature value (scalar or vector)) on current waveform data of the time interval(s) extracted by the target interval extraction part 102.

The state estimation part 103 may calculate a feature value of the current waveform based on a waveform shape in a time domain (peak value, effective value, mean value, crest value, etc.) or may find a waveform pattern in a time domain as a feature value. Alternatively, a current waveform data may be converted into a frequency domain by performing Fourier transform (Fast Fourier Transform; FFT) or Discrete Fourier Transform (DFT), and a feature value may be calculated based on frequency spectrum components. A feature value of the current may be calculated based on, for example, a value obtained by adding squares of amplitudes of harmonic components of an AC power frequency, which is the fundamental frequency, or a value obtained by adding squares of amplitudes of even-order harmonic components or odd-order harmonic components. A total harmonic distortion (THD) may be used as a feature value of a current. For air conditioning facility provided with an inverter that generates a high-frequency noise in a power line, the state estimation part 103 may calculate a feature value of a current based on frequency spectrum components of high-frequency components extracted by a high-pass filter (HPF).

The state estimation part 103 may perform, for example, machine learning with respect to a state of a facility and current information (waveform, feature value, etc.), and estimate a state of the facility (change in a state) based on current information (waveform, feature value, etc.) of an extracted time interval.

In machine learning that classifies supplied data into two classes using a linear discriminant function, for an input vector such as a current waveform or feature value vector: x=(x1, x2, . . . , xd) (x is assumed to be a d dimensional vector), learning is performed so that an output in a certain state is +1 (class 1: state 1), else an output is −1 (class 2: other than state 1), $$y=f(x)=\text{sign}(w^T x)=\text{sign}(w1x1+w2x2+ \ldots +wdxd)$$

(where sign ( ) is sign function; +1 if an argument is 0 or more, −1 if the argument is less than 0, w=(w1, w2, . . . , wd) is a model parameter (weight); and T is a transpose operator), for data whose output is y=+1 (class 1), $w^T x > 0$
for data whose output is y=−1 (class 2), $w^T x < 0$.

The weight w is adjusted so that the input/output of the training data can be reproduced.

Further, as a supervised learning technique, support vector machine (SVM), k-nearest neighbor method (k-NN method), or neural network (NN) may be used. Further, as an unsupervised learning technique, clustering (for example, k-means clustering method such as k-means method, etc.) may be used.

Alternatively, by using a model that quantifies a state of a facility (for example, deterioration degree), the state estimation part 103 may derive a formula f that approximates a state of the facility, based on the state of the facility corresponding to time-series data of current information (current waveform, feature values), using, for example, regression analysis, to estimate a state of facility (for example, deterioration degree) $f(x_N)$ associated with current information $x_N$ at a certain time $t_N$.

Further, when a state of the facility estimated by the state estimation part 103 at a time $t_N$ or a later time changes, by a predetermined value (threshold value) or more, from a state of the facility estimated at previous times t1 to $t_N-1$, it is estimated that the state has changed at the time $t_N$. Also in this case, the state estimation part 103 may detect a change in a state by learning a threshold value for determining a change in a state of the facility by machine learning.

The temporal change estimation part 104 performs a filtering process corresponding to a time change rate (time constant) of an estimated change on an estimated state (state change) and estimates a temporal change in the state.

Note that the time constant τ corresponds to the time t=τ for, for example, a rising waveform (amplitude $Y_0$) of exponential function characteristics:

$$Y(t) == Y_0 \left(1 - \exp\left(-\frac{2t5}{\tau}\right)\right)$$

to reach $0.632Y_0$ ($Y(\tau)=Y_0(1-\exp(-1))\approx 0.632Y_0$) from an initial value 0.

Similarly, it corresponds to the time $t=\tau$ for a falling waveform of exponential function characteristics having an initial value $Y_0$:

$$Y(t) == Y_0 \exp\left(-\frac{t}{\tau}\right)$$

to reach $Y(\tau)=Y_0 \exp(-1)\approx 0.368Y_0$ from the initial value $Y_0=Y(0)$.

When a temporal change in a state of the facility does not have an exponential function characteristic, the definition above cannot be directly applied to a temporal change in a state of the facility. However, in accordance with a filtering process (for example, a cutoff frequency $f_c$ of a low-pass filter is $1/(2\pi\tau)$: $\tau$ is a time constant) corresponding to a temporal change in the state, the present description uses the term "time constant" for a change over time in a state of a facility.

In a filtering process performed by the temporal change estimation part 104, a digital filtering process such as FIR (Finite Impulse Response) and IIR (Infinite Impulse Response) filtering may be applied on time-series data of a signal value (which may be a current waveform or a feature value of a current waveform) indicating a deterioration degree of a facility (also referred to as "risk of failure"). Alternatively, this may be implemented by performing a Fourier transform (Fast Fourier Transform or Discrete Fourier Transform) on a current waveform (feature value) in a time domain, cutting off a frequency spectrum less than a predetermined frequency band, and converting the frequency spectrum back to the time domain by Inverse Fourier Transform. Fourier transform may be performed on the time-series data of the current information which has a positive correlation with a deterioration degree of the facility. Alternatively, the output part 105 outputs an estimation result of a change over time in a state of the facility to a display apparatus. Alternatively, the output part 105 may transmit an estimation result of a change over time in a state of the facility to a terminal or host (not illustrated in the drawings) via a communication interface or network (not illustrated in the drawings).

Figure 2A:
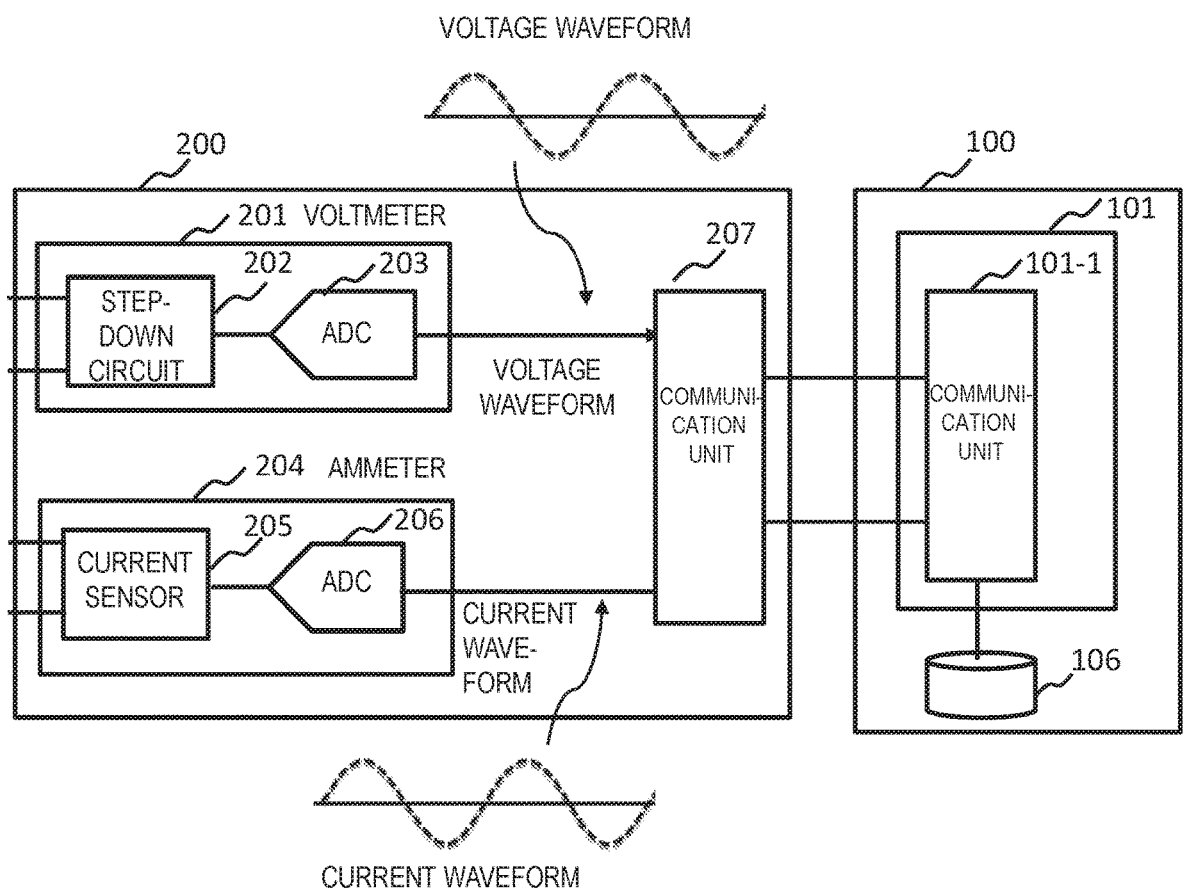
FIG. 2A is a diagram illustrating an example of an example embodiment of the present invention.
Figure 2B:
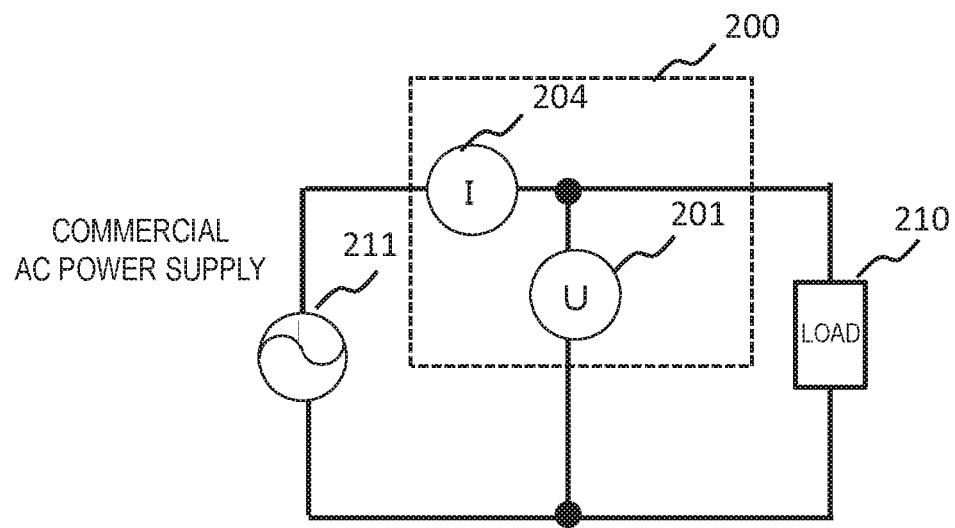
FIG. 2B is a diagram illustrating connection of a voltmeter and an ammeter.

FIG. 2A is a diagram illustrating a configuration example of the sensor 200 of FIG. 1. FIG. 2A shows a single phase two wire AC system for the sake of simplicity, however, measurement can be performed using, for example, three single-phase wattmeters in a case of a three phase three wire AC system. Alternatively, the power may be measured based on a two-wattmeter method. In FIG. 2A, the sensor 200 may be configured to include a voltmeter 201 (U in FIG. 2B) that measures a voltage across terminals of a facility (load 210 in FIG. 2B), and an ammeter 204 (I in FIG. 2B) that measures a current flowing through the facility (the load 210 in FIG. 2B). The voltmeter 201 may be configured to include a step-down circuit 202 that steps down a voltage across terminals of the load (210 in FIG. 2B), and an analog-to-digital converter 203 that converts an analog output voltage from the step down circuit 202 to a digital signal. The ammeter 204 may be configured to include a current sensor 205 that detects a current flowing through a power supply line (power supply line connected to the load 210 in FIG. 2B), and an analog-to-digital converter 206 that converts an analog output signal from the current sensor 205 to a digital signal. For example, the current sensor 205 may be configured to measure a voltage across terminals of a shunt resistor (not illustrated in the drawing) inserted in the power supply line, or the current sensor 205 may be constituted by a CT (Current Transformer; for example, Zero-phase-sequence Current Transformer (ZCT)) that has a current transformer structure, in which a coil is wound around a magnetic core, and detects a current by sandwiching a cable whose current is measured and converting a detected value of a magnetic flux flowing through the magnetic core, or a hall element to the current.

Voltage information and the corresponding current waveform data are supplied to a communication unit 207, which transmits the voltage information and the corresponding current waveform data to the voltage/current information acquisition part 101. The communication unit 207 may transmit the voltage information and the corresponding current waveform data to the voltage/current information acquisition part 101 along with measurement time information.

The communication unit 101-1 of the voltage/current information acquisition part 101 communicates with the communication unit 207 of the sensor 200, receives time-series data of the measured voltage and current, and stores the time-series data received in the storage apparatus 106. At this time, the communication unit 101-1 may store time information on the voltage and current measured by the measuring instrument 200 in the storage apparatus 106 in association with the time-series data of the voltage and current. The voltage/current information acquisition part 101 may utilize a zero cross point of the time-series data of the voltage waveform, divide the current time-series data into each cycle of a commercial AC power supply (211 in FIG. 2B), and store the divided data in the storage apparatus 106. According to the present example embodiment, the sensor 200 does not require a high-performance wattmeter.

It goes without saying that the voltage/current information acquisition part 101 is not limited to the configuration that includes or is connected to the sensor 200 as described above. The voltage/current information acquisition part 101 may acquire the voltage waveform/current waveform (having a length of a cycle of the commercial power frequency or less, for instance) of each facility, by disaggregating a current waveform acquired from, for example, a smart meter or current sensor. A high-performance wattmeter is not required in this case, either.

Figure 3A:
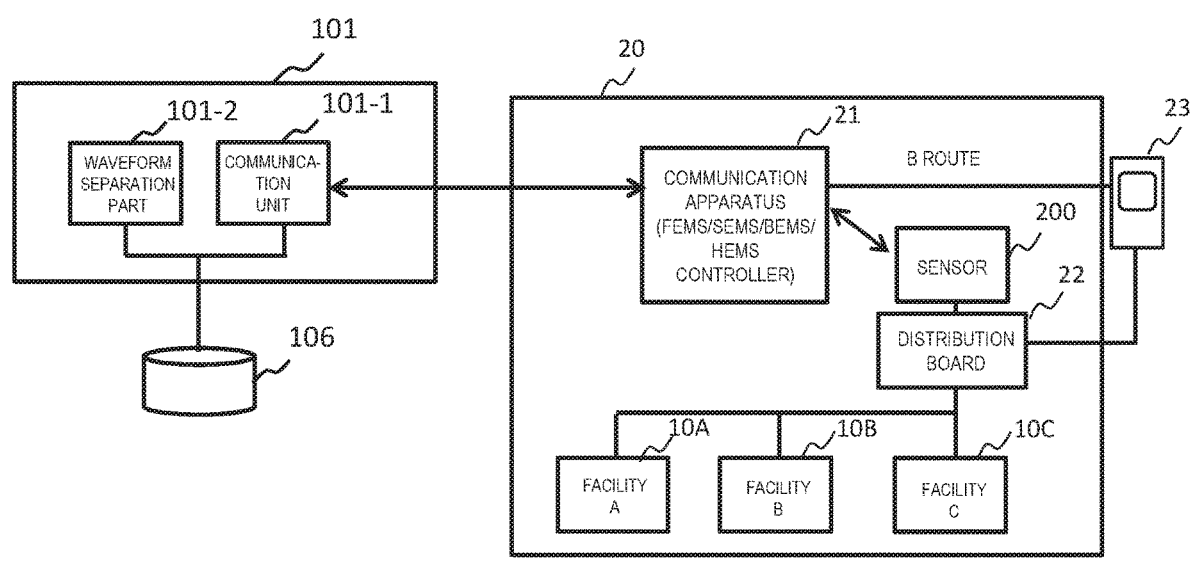
FIG. 3A is a diagram illustrating another example of an example embodiment of the present invention.

FIG. 3A is a diagram illustrating an example in which the voltage/current information acquisition part 101 disaggregates a power supply current waveform into an individual current waveform of each facility, using, as the sensor 200 in FIG. 1, a sensor 200 installed in a main breaker or a branch breaker of the distribution board or a smart meter 23. With reference to FIG. 3A, in a building 20, a communication apparatus 21 may be constituted by a controller such as FEMS (Factor Energy Management System), SEMS (Store Energy Management System), BEMS (Building Energy Management System), or HEMS (Home Energy Management), and meter reading data (voltage waveform, current waveform, etc.) of the smart meter 23 is acquired from a B route, for instance. The meter reading data (power, current waveform, etc.) acquired by the communication apparatus 21 from the smart meter 23 via the B route includes information on power consumption of the entire building 20. Further, at least one branch breaker (not shown) or a main breaker of a distribution board 22 includes the sensor 200 that detects, for example, voltage and current. The sensor 200 may wirelessly transmit the voltage and current information to the communication apparatus 21. The sensor 200 may wirelessly transmit the voltage and current information to the communication apparatus 21 via a Wi-SUN (Wireless Smart Utility Network).

The voltage/current information acquisition part 101 includes a communication unit 101-1 and a waveform disaggregation part 101-2. The communication unit 101-1 communicates with the communication apparatus 21, acquires voltage/current information acquired by the sensor 200 or the smart meter 23, disaggregates the information into individual voltage and current waveforms specific to each of the facilities A to C (10A to 10C), and stores the waveforms in the storage apparatus 106.

Figure 3B:
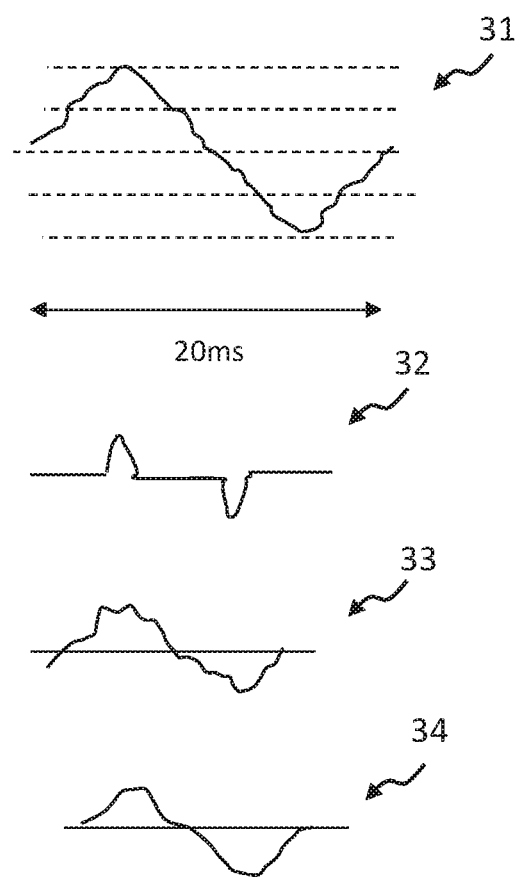
FIG. 3B is a drawing schematically illustrating an example of a composite waveform of a plurality of facilities and separated waveforms of the facility.

FIG. 3B is a diagram illustrating current waveforms acquired by the sensor 200 installed in the distribution board 22 in FIG. 3A. The waveform separation part 101-2 separates composite current waveform data 31 of facilities A to C (10A to 10C) into an individual current waveform of each facility A to C (10A to 10C) using, for example, the technique of the Non-Patent Literature 1. Waveforms 32 to 34 schematically illustrate disaggregated current waveforms of the facility A to C (10A to 10C). In a case of the configuration illustrated in FIG. 3A, a cost can be reduced greatly, as compared with a case where each facility 10 includes the sensor 200 (FIG. 2A). It is noted that in FIG. 3A, the waveform separation part 101-2 of the voltage/current information acquisition part 101 may be provided locally in the building 20 (the storage apparatus 106 may be provided in a cloud in this case).

Figure 4:
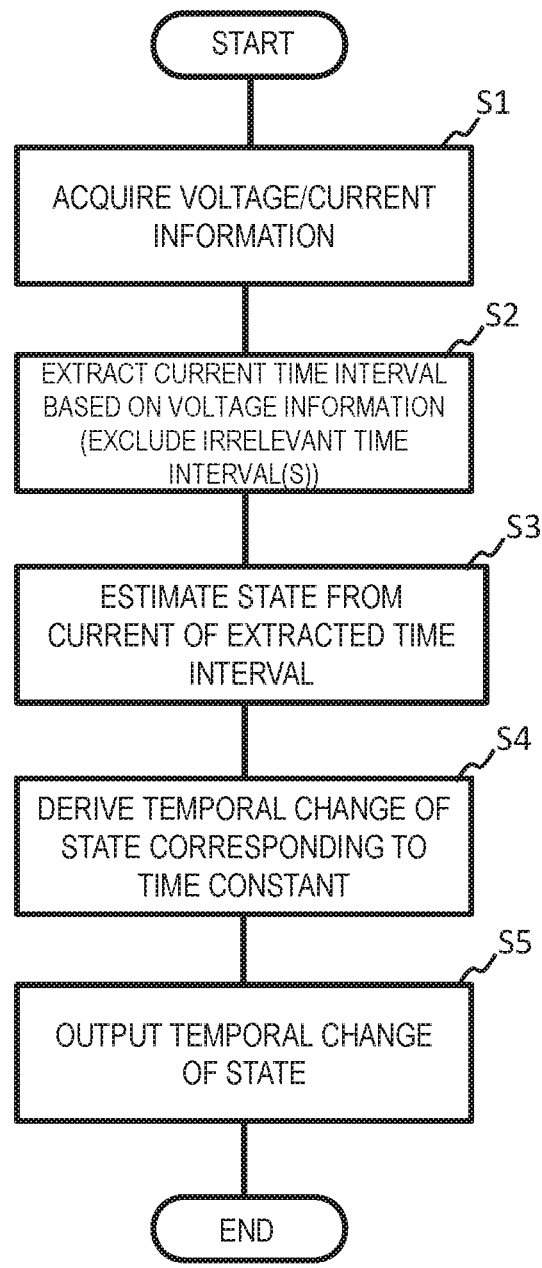
FIG. 4 is a flowchart illustrating the operation of an example embodiment of the present invention.

FIG. 4 is a diagram illustrating a processing procedure example of the embodiment described with reference to FIG. 1, etc. The processing procedure of the example embodiment will be described with reference to FIG. 4.

The voltage/current information acquisition part 101 of FIG. 1 acquires time-series data of voltage/current information on a facility (S1).

The target interval extraction part 102 of FIG. 1 selects a time interval(s) associated with, for example, a specific voltage state from the current time-series data (S2). The target interval extraction part 102 may be also configured to extract a time interval(s) associated with a specific voltage state, by excluding, from the current time-series data, a time interval(s) corresponding to a voltage other than the specific voltage state.

The state estimation part 103 of FIG. 1 estimates a state of the facility based on the current waveform of the time interval(s) selected by the target interval extraction part 102 (S3).

The temporal change estimation part 104 of FIG. 1 derives a temporal change (change over time) in a state corresponding to a time constant of an extraction target based on time-series information of an estimated state (S4).

The output part 105 outputs an estimation result of a temporal change in the state of the facility (S5).

According to the example embodiment, even when a temporal change in a state of the facility is minute, it becomes possible to appropriately estimate a temporal change by separating it with filtering from a temporal change(s) due to other factor(s). As a result, it becomes possible to effectively plan maintenance and cleaning of the facility.

Further, when current information is used, information regarding various temporal changes (change over time, aging over year, etc.) may also be measured (for example, temperature change measured by a temperature sensor, vibration change measured by a vibration sensor, cleaning time information, aging degradation information, etc.).

According to the example embodiment, it is possible to appropriately estimate information regarding a temporal change corresponding to a desired time length (a sudden change in a short time interval, a slow change in a long time interval) about change in a state of the facility by performing the following processes (a) to (c). As a result, it becomes possible to detect a temporal change with practical accuracy while suppressing an increase in cost.

(a) The target interval extraction part 102 of FIG. 1 selects and extracts a time interval (s) to be an estimation target from time-series data of current flowing through the facility, based on a sampled value of an AC voltage applied to the facility.

(b) The state estimation part 103 of FIG. 1 estimates a state (a change in a state) of the facility based on waveform data of the current of the selected time interval.

(c) The temporal change estimation part 104 applies a filtering process using a time constant corresponding to a temporal change to be extracted on an estimated state change to extract a change over time in the state.

In the process (a), a time interval (period) during which a statistical value of a voltage value (maximum value, mean value, variance, etc.) is found to be at a certain numerical value or within a certain range, or a time interval which is found to have the same relationship (correlation function, correlation coefficient, covariance, etc.) as a preset reference waveform, may be extracted.

Figure 6:
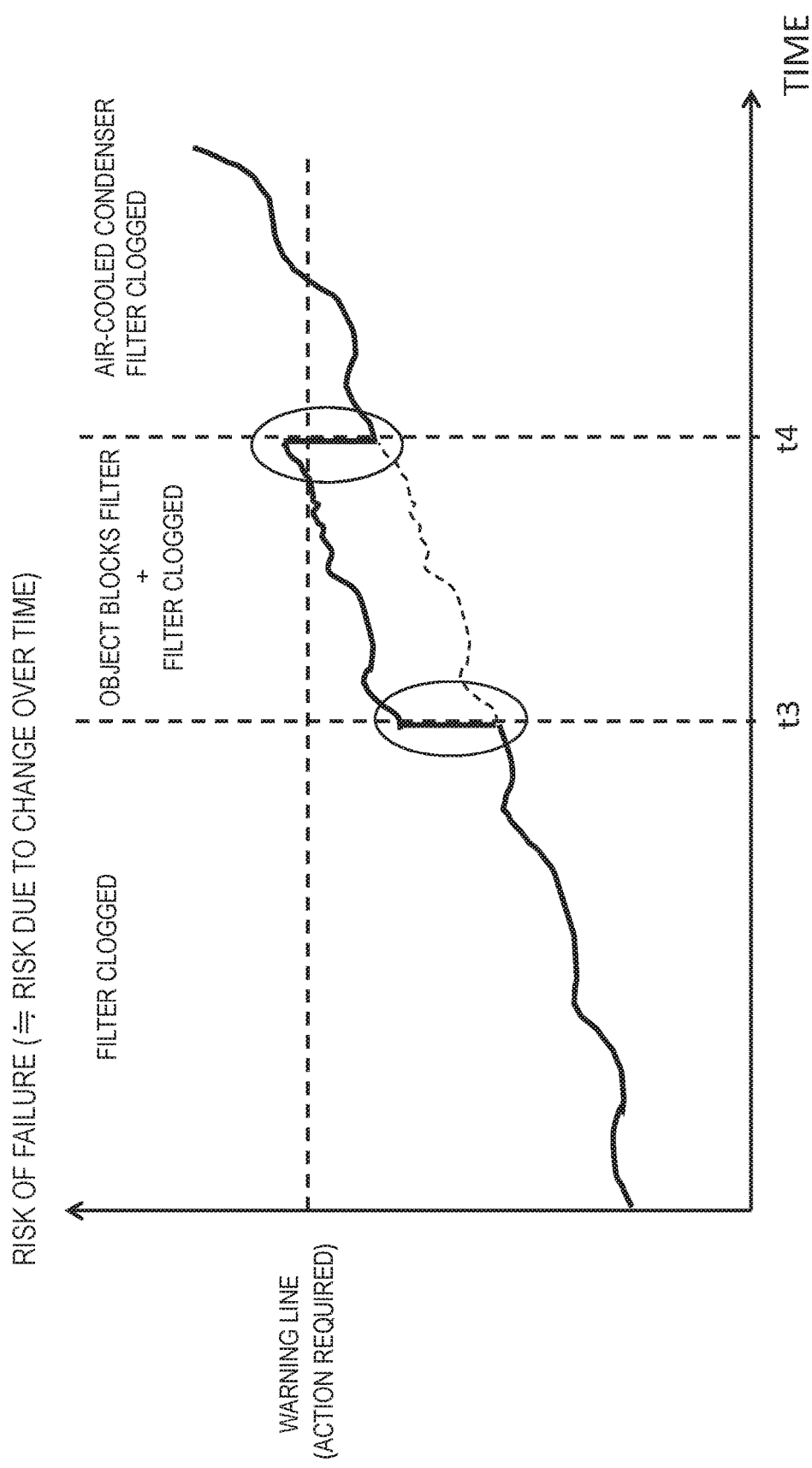
FIG. 6 is a diagram illustrating an example embodiment of the present invention.

FIG. 6 is a diagram illustrating an example of a change over time of a state in a case where a filter of an air curtain air-conditioner is clogged and also blocked by an object (luggage, etc.).

For example, a store such as a convenient store or supermarket uses an open type freezer (air curtain refrigerator) that shields an open area of a showcase displaying products (frozen food, etc.) from the outside air by forming an air curtain. Cooled air is circulated by a fan in the freezer, air sucked into a suction part is cooled by heat exchange using a cooler, and the cooled air is blown out from the air curtain outlet into the freezer. In an air conditioning facility such as an air curtain refrigerator, for example, clogging of an air-cooled condenser filter reduces cooling capacity, increasing the power consumption and eventually causing facility failure. In an open type air curtain freezer, for example, when a vicinity of an air curtain outlet is blocked with a product(s), etc., an effect of shielding off outside air by the air curtain is reduced, lowering of a refrigeration performance in the freezer and increase in power consumption may be incurred. Further, when an air-cooled condenser filter is blocked by an object(s), a state of the refrigerator (deterioration state) indicates a more sudden temporal change, as compared with a relatively gradual change over time (aging over year) due to filter clogging. In this case, a sudden temporal change in the state can be extracted by applying a filtering process using a relatively short time constant τ (high-pass filtering) on a state of a time interval to be analyzed. Further, a relatively gradual change over time due to filter clogging can be extracted by performing a filtering process using a relatively long time constant τ (low-pass filtering).

In FIG. 6, a horizontal axis represents time, and a vertical axis represents a risk of failure (risk due to change over time). A deterioration state, due to clogging of an air-cooled condenser filter of an air curtain freezer, progresses gradually with time. When an object (s) block the air-cooled condenser filter, a risk of failure suddenly increases at a time t3. When the object (s) blocking the filter is removed at a time t4, the risk of failure returns to a temporal transition curve (change over time) caused by clogging of the filter alone.

Further, in FIG. 6, the risk of failure on the vertical axis may show a numerical representation of a deterioration state of the facility. Alternatively, the risk of failure may be a signal (for example, current flowing through a facility) having a positive correlation with the risk of failure (deterioration state of the facility).

The temporal change estimation part 104 of FIG. 1 is able to separate and extract a degree of progress of clogging in the filter by applying a filtering process (low-pass filter with a cutoff frequency of $1/(2\pi\tau)$) corresponding to the time constant $\tau$ of the clogging of the air-cooled condenser filter on the time-series data in FIG. 6.

Further, the temporal change estimation part 104 of FIG. 1 is able to separate and extract a state change caused by the blocking object (s) by applying a filtering process (high-pass filter) using a cutoff frequency corresponding to the clogging of the air-cooled condenser filter+the blocking by the object (s) (luggage(s)).

While a state of the air-cooled condenser filter clogging slowly changes over a period of days to weeks, a change caused by placing an object(s) blocking the air-cooled condenser filter or removing the object(s) is a fast one of a few minutes to a few hours, and it is possible to clearly distinguish between them using a filtering process.

When a product(s), etc., block a vicinity of an air curtain outlet, reducing an effect of shielding off outside air and increasing current consumption of the air curtain freezer, it is possible to similarly separate and extract a state change caused thereby from a state change caused by clogging of the filter.

As described above, according to the example embodiment, by focusing on a temporal change of a target state, an effect of a temporal change in the state can be estimated appropriately. According to the example embodiment, by enabling to estimate a change over time in a state of the facility, it becomes possible to facilitate an action (measure) such as an appropriate preventive maintenance.

Further, the temporal change estimation part 104 of FIG. 1 may exclude, from an analysis target, such a time interval (s) corresponding to an operating mode(s) of a facility unaffected by a state change as a standby state or power-off state, in time-series data of current. For instance, when an operating current of the facility is 10 amperes and a standby or power-off current is in the order of milliamperes, the temporal change estimation part 104 of FIG. 1 excludes a time interval(s) during which the current value of the facility is zero or in the order of milliamperes, from a target for estimating a temporal change of a state.

Alternatively, the temporal change estimation part 104 of FIG. 1 may obtain a time interval(s) associated with an operating mode(s) unaffected by a temporal change (change over time) such as a standby state or power-off state, from the time-series data of the current, based on operation history information of facility, and exclude, from an analysis target, a time interval(s) associated with a standby state and a power-off state. The temporal change estimation part 104 may obtain the operation history information of the facility from a management server that manages the facility (not shown).

Figure 7A:
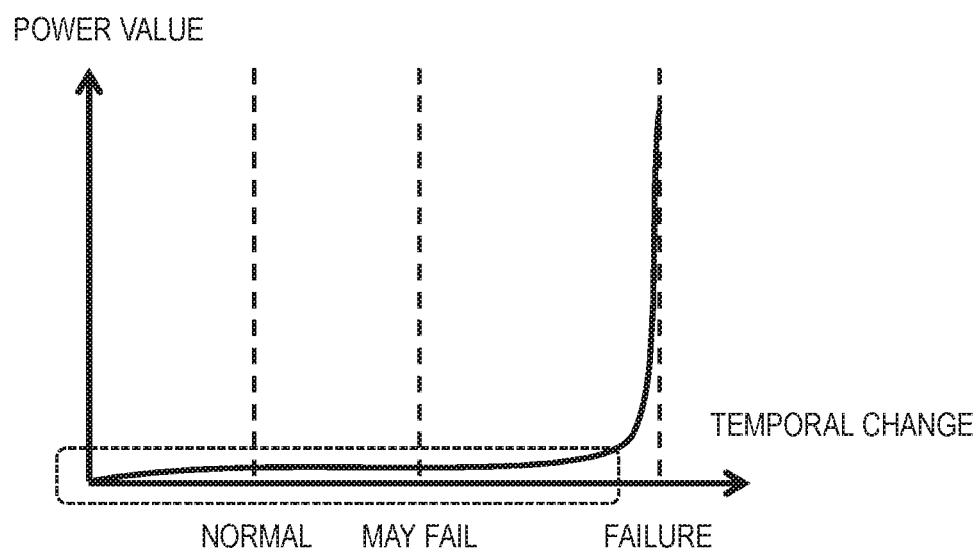
FIG. 7A is a diagram illustrating relationship between power value and change over time.

FIG. 7A is a diagram illustrating an example of the relationship between the power value and change over time (temporal change) of the facility 10 in FIG. 1. A horizontal axis is a change over time (state of the facility), and a vertical axis is a power value of the facility. From "NORMAL" to "MAY FAIL" ("PAY ATTENTION TO FAILURE") on the horizontal axis, the power value does not change much with time. The power value rises immediately before failure, and when the facility does fail, the power value shows a marked rise.

The case in FIG. 7A shows that deterioration of the facility is observed as a difference in power value only after the deterioration has progressed considerably. In a region surrounded by a dashed line, the power value does not show a significant difference with respect to progress of deterioration of the facility (the power value does not change much).

Figure 7B:
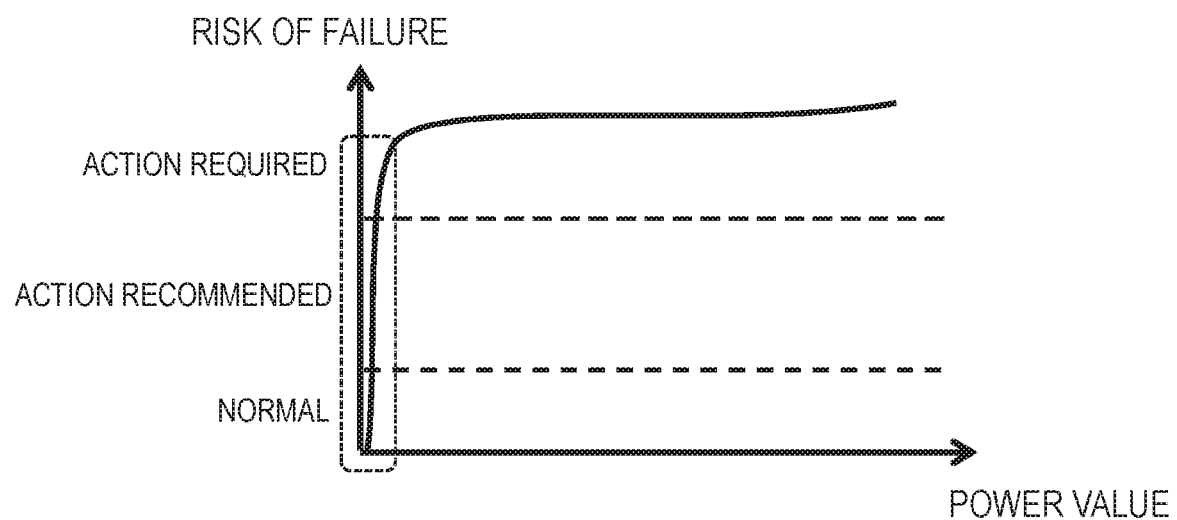
FIG. 7B is a diagram illustrating relationship between power values and the risk of failure.

FIG. 7B is a diagram illustrating a relationship between a power value illustrated in FIG. 7A and a risk of failure. A horizontal axis is a power value, and a vertical axis is a risk of failure of the facility (corresponding to the vertical axis in FIG. 6). "ACTION RECOMMENDED" in the risk of failure axis indicates that a maintenance action is recommended, and "ACTION REQUIRED" indicates that maintenance is required.

Further, in FIGS. 7A and 7B, exceeding a rated power of the facility may cause further product deterioration or breakdown in addition to an original failure. When a failure occurs, the power to the facility is cut off (for example, cut off by a breaker, when an overcurrent is detected in the facility or in the event of a short-circuit failure), or the facility stops working.

The example of FIG. 7B shows that, for a slight change in the power value, the risk of failure changes abruptly from "NORMAL" to "ACTION RECOMMENDED" and "ACTION REQUIRED." For this reason, the power value is not suitable for detecting a sign of failure.

Further, in order to detect a change over time such as from "NORMAL" to "MAY FAIL", by using the power value in FIG. 7A, a high-performance wattmeter is required. Therefore, when power consumption information of each facility is obtained from a current waveform acquired by the sensor 200 connected to a distribution board by using a disaggregation technology described in Non-Patent Literature 1, it may be difficult to detect a slight change in the power value.

Therefore, in the example embodiment, estimation of a state of a facility (deterioration degree or abnormality) is performed by analyzing information of current flowing through the facility. Further, in order to accurately estimate a temporal change (change over time) in a state of the facility, a change in a state of the facility is estimated based on the current waveform of a time interval(s) corresponding to a specific voltage state.

Figure 8A:
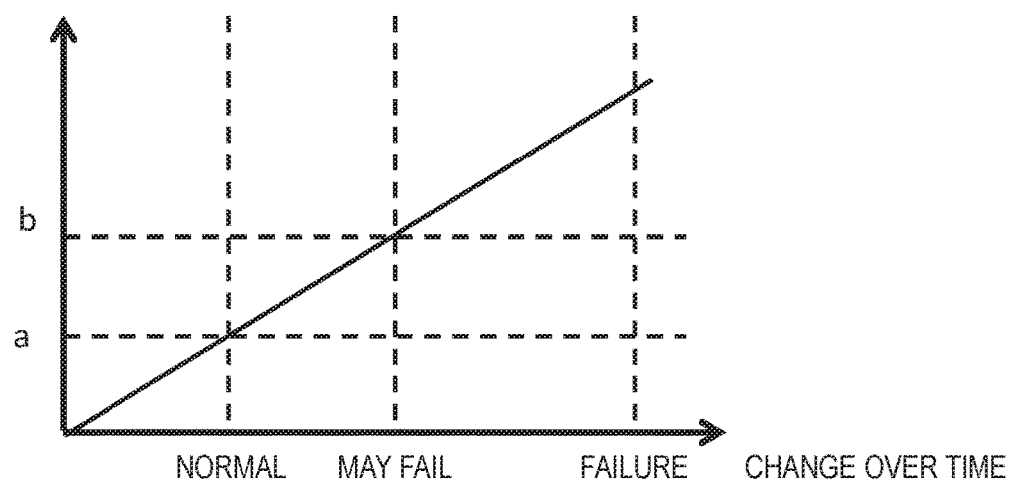
FIG. 8A is a diagram illustrating the relationship between current information and change over time.

FIG. 8A is a diagram illustrating the relationship between current information and change over time of facility. The horizontal axis is a change over time, and a vertical axis is current information of the facility (partial information and processed value). The current information changes (monotonously increases) at a constant rate until a failure occurs. The partial current information may correspond to a part of time interval of time-series data of the current information. The processed values of the current information may include a feature value described above.

Figure 8B:
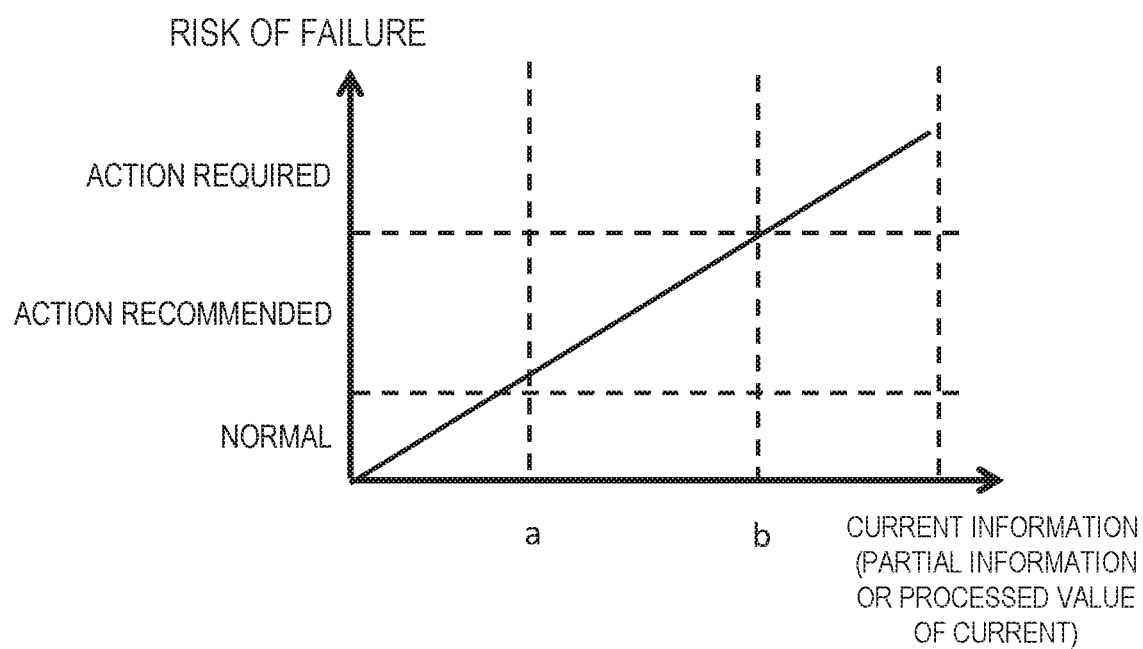
FIG. 8B is a diagram illustrating the relationship between current information and the risk of failure.

FIG. 8B is a diagram illustrating relationship between current information and a risk of failure of the facility. A horizontal axis is current information (partial information and processed values), and a vertical axis is a risk of failure of the facility (corresponding to the vertical axis in FIG. 6). The risk of failure changes from "NORMAL" to "ACTION IS RECOMMENDED" to "ACTION IS REQUIRED" in proportion to an increase in a current value. "a" and "b" in the current information (partial information and processed values) on the horizontal axis in FIG. 8B correspond to "a" and "b" in FIG. 8A, respectively.

Since current information, change over time, and risk of failure exhibit a relationship as illustrated in FIGS. 8A and 8B, the state estimation part 103 may estimate a state of the facility, by using the current information as an indicator of a risk of failure.

The state estimation part 103 may detect a risk of failure such as "NORMAL," "ACTION RECOMMENDED," and "ACTION REQUIRED" by acquiring a detailed current waveform pattern for each cycle of a commercial AC power supply and comparing a risk of failure, which is calculated from a feature value(s) extracted from the current waveform or the current information, with a preset threshold value ("a" and "b" in FIGS. 8A and 8B).

When detecting the risk of failure such as "NORMAL," "ACTION RECOMMENDED," and "ACTION REQUIRED" in FIG. 8B, the state estimation part 103 may use machine learning techniques (for example, Support Vector Machine (SVM), k-Nearest Neighbor Method (k-NN method), Neural Network (NN), Local Outlier Factor Method (LOF method), and k-Means Clustering Method (k-Means method)).

In FIGS. 8A and 8B, only for the sake of simplification, the relationships between the current information, change over time, and the risk of failure are indicated by straight lines. In FIG. 8B, when the risk of failure has characteristics as illustrated in FIG. 6, the horizontal axis may be divided into a plurality of sections and the risk of failure may be approximated by a spline curve for each section.

In FIG. 8B, when the facility is a one used to manufacture a product, a product defect rate may be used as the risk of failure. When the defect rate is a predetermined value, the risk of failure reaches "ACTION REQUIRED," and a defect rate of 1 (all products are defective) indicates a failure. In a case of an air conditioner, based on a cooling COP (Coefficient of Performance) that is a cooling capacity per 1 kW (Kilowatt) of power consumption during cooling, COP=cooling capacity (kW)÷cooling power consumption (kW)), the risk of failure may be given as follows.

Risk of failure=1−cooling COP.

Patent Literature 3 cited above describes, regarding change over time information, the following two methods:
(1) Determining parameter(s) of predefined temporal characteristics (formula(s)) by using fitting; and
(2) Using difference between an average value in a certain range of measured values and a latest value as a change over time component.

In a case of (1), since the time characteristics of a change over time must be known to some extent from experience of workers or the like and it is difficult to separate other error factors (measurement errors, etc.), it is unlikely that this method is able to extract alone a change over time component.

In the case of (2), it is not necessary to know the time characteristics in advance, however, a process of setting a time range used to extract a temporal change component is not quantitative, and it is also difficult to separate other error factors (measurement errors, etc.). Therefore, it is also unlikely that this method is able to extract alone a change over time component. Therefore, it cannot be said that the methods disclosed in Patent Literature 3 is able to estimate a change over time accurately.

In the example embodiment described above, the target interval extraction part 102 selects a time interval(s) (period (s)) of current based on a voltage value (RMS (root mean square) value) of an AC voltage applied to the facility, however, a power may be used instead of the voltage. In this case, a reference power value (for example, an average value) is set in a measurement period (for example, one hour). The target interval extraction part 102 may calculate a power value corresponding to each sampling time of a current waveform and select a time interval (s) (period (s)) of the current including the sampling time, as an analysis target, when the calculated power value matches a reference power value (for example, an average value). Further, the power may be calculated from voltage/current information acquired by the voltage/current information acquisition part 101, or a real power may be calculated from a voltage waveform (digital value) and a current waveform (digital value) acquired by the voltmeter 201 and the ammeter 204 in the sensor 200, and the real power may be transmitted to the voltage/current information acquisition part 101 along with the current information.

The example embodiment described above uses time-series data of a voltage waveform and time-series data of a risk of failure (FIG. 6) as time-series data of a signal for extracting a time interval (period) as an estimation target, however, it goes without saying that information from at least one of a vibration sensor, acoustic sensor, and temperature sensor may be used. For instance, it is possible to use a current sensor and a temperature sensor.

Figure 9:
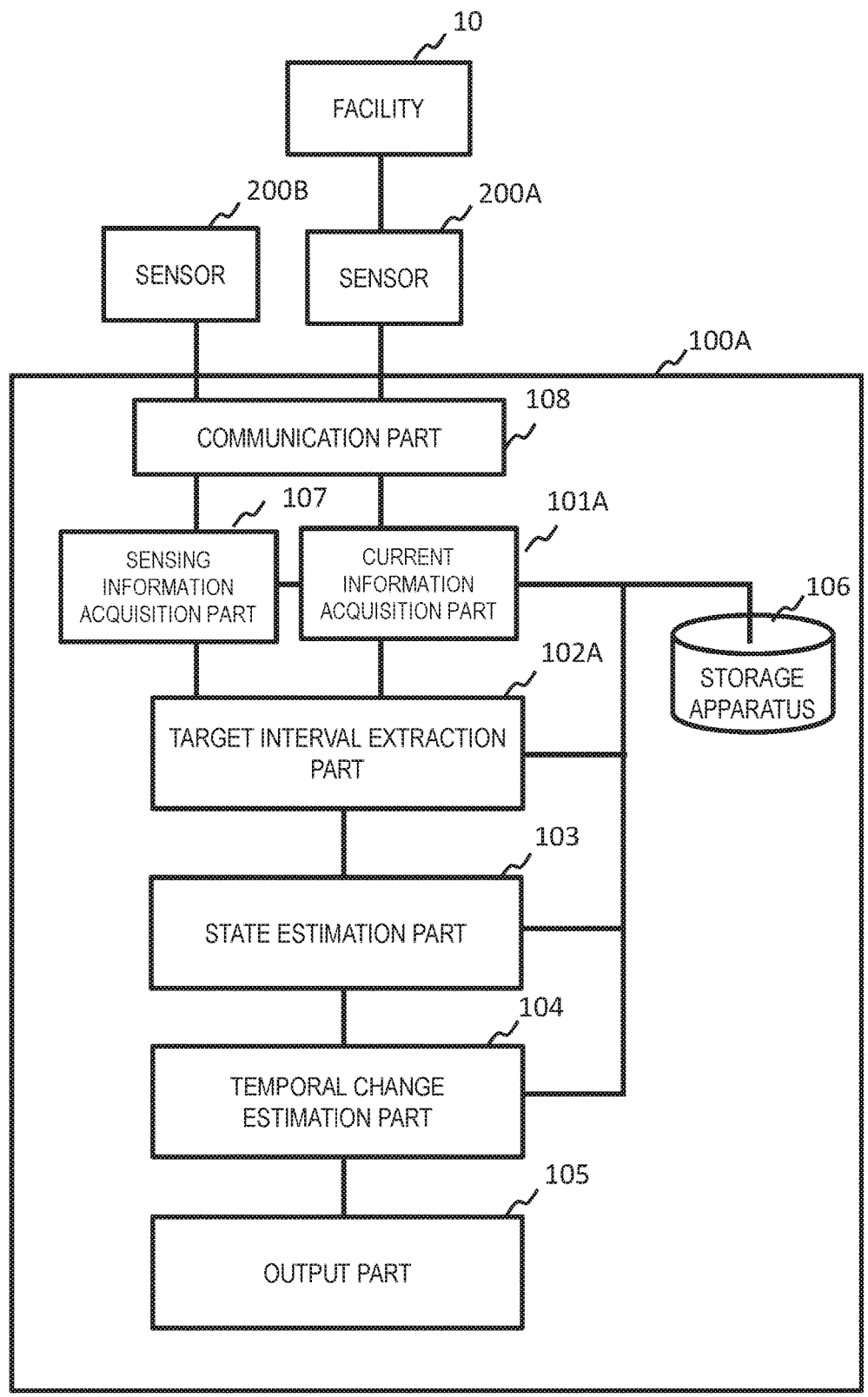
FIG. 9 is a diagram illustrating a variation of the example embodiment of the present invention.

FIG. 9 is a diagram illustrating another example embodiment. In FIG. 9, a sensor 200A is a current sensor and constituted by an ammeter 204 and the communication unit 207 in FIG. 2A. A sensor 200B is, for example, a temperature sensor. A current information acquisition part 101A acquires current information (time-series data) from the sensor 200A via a communication unit 108 and stores the data in the storage apparatus 106. A sensing information acquisition part 107 acquires temperature information (time-series data) from the sensor 200B via the communication unit 108 and stores the data in the storage apparatus 106. It is noted that the storage apparatus 106 may store the current information and the temperature information in association with a sampling time at which they were sampled.

In the present example embodiment, for example, an average value is calculated from temperature information acquired during a measurement period (for example, one hour) to set a reference temperature value. A target interval extraction part 102A may refer to the temperature information corresponding to the sampling time of the current information stored in the storage apparatus 106 and select a time interval(s) (period(s)) of the current including the sampling time as an analysis target when the temperature matches a reference temperature value (such as the average value).

Instead of temperature, humidity, vibration, and atmospheric pressure can be similarly utilized by using the sensor 200B as a humidity sensor, vibration sensor, or atmospheric pressure sensor.

Figure 10:
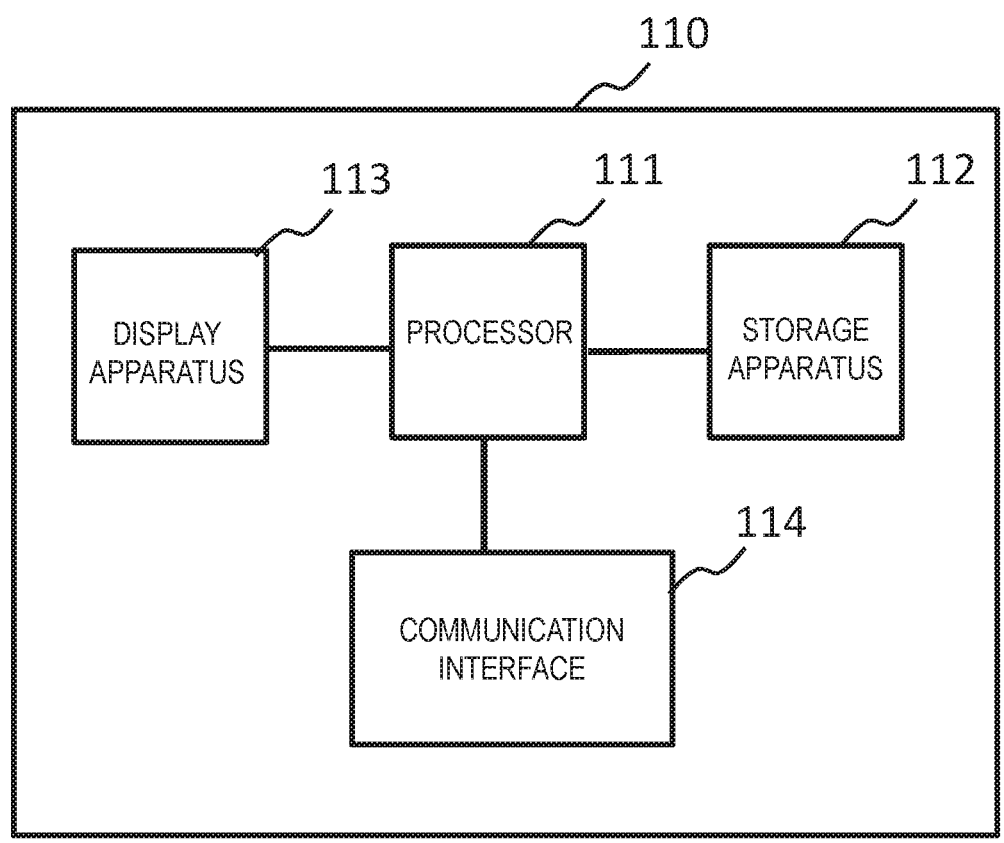
FIG. 10 is a diagram illustrating yet another example embodiment of the present invention.

Further, it is noted that the state estimation apparatuses 100 and 100A in FIGS. 1 and 9 may be implemented in a computer system illustrated in FIG. 10. With reference to FIG. 10, a computer system 110 such as a server computer includes a processor (CPU (Central Processing Unit), data processing device) 111, a storage apparatus 112 that includes at least one of a semiconductor memory (for example, RAM (Random Access Memory), ROM (Read Only Memory), EEPROM (Electrically Erasable and Programmable ROM), etc.), HDD (Hard Disk Drive), CD (Compact Disc), and DVD (Digital Versatile Disc), a display apparatus 113, and a communication interface 114. The communication interface 114 functions as a communication unit (101-1 in FIGS. 2A and 3A), wherein the voltage/current information acquisition part 101 in FIG. 1 receives, via a communication network, voltage/current information acquired by the sensor 200. The communication interface 114 also functions as the communication unit 108 in FIG. 9. The output part 105 in FIGS. 1 and 9 outputs an estimation result of a change in a state to, for example, the display apparatus 113. The storage apparatus 112 may be the same device as the storage apparatus 106 in FIGS. 1 and 9. The storage apparatus 112 may store a program that realizes the functions of the state estimation apparatuses 100 and 100A in FIGS. 1 and 9, and the state estimation apparatuses 100 and 100A of the example embodiments described above may be realized by having the processor 111 read and execute the program. The computer system 110 may be implemented as a cloud server that provides a state estimation service to a client as a cloud service.

Further, each disclosure of Patent Literatures 1 to 3 and Non-Patent Literature 1 cited above is incorporated herein in its entirety by reference thereto. It is to be noted that it is possible to modify or adjust the example embodiments or examples within the whole disclosure of the present invention (including the claims) and based on the basic technical concept thereof. Further, it is possible to variously combine or select a wide variety of the disclosed elements (including the individual elements of the individual claims, the individual elements of the individual examples and the individual elements of the individual figures) within the scope of the claims of the present invention. That is, it is self-explanatory that the present invention includes any types of variations and modifications to be done by a skilled person according to the whole disclosure including the claims, and the technical concept of the present invention.

The example embodiments described above can be appended, for example, as the following Supplementary Notes (but not limited thereto).

(Supplementary Note 1)
A state estimation apparatus comprising:
a first means that extracts a time interval to be analyzed from a time series of a first signal based on a second signal acquired in conjunction with the first signal relating to the operation of the facility; and
a second means that estimates a change in the state of the facility based on waveform data of the selected time interval of the first signal.

(Supplementary Note 2)
The state estimation apparatus according to Supplementary Note 1, wherein the first means selects the time interval of the first signal as an analysis target when the second signal corresponding to a certain time interval in the time series of the first signal is at a predetermined value or in a predetermined state.

(Supplementary Note 3)
The state estimation apparatus according to Supplementary Note 2, wherein the first means excludes a time interval corresponding to an operating mode unaffected by a change in the state of the facility as an analysis target from the time series of the first signal.

(Supplementary Note 4)
The state estimation apparatus according to any one of Supplementary Notes 1 to 3, wherein the first means uses current and voltage information of the facility as the first and second signals, respectively, and extracts a time interval of the current of the facility operating at the voltage of a specified value or in a specified range.

(Supplementary Note 5)
The state estimation apparatus according to Supplementary Note 4, wherein the second means estimates a change in the state of the facility from time-series data of the current information of the extracted time interval.

(Supplementary Note 6)
The state estimation apparatus according to any one of Supplementary Notes 1 to 4, wherein the second means performs a filtering process corresponding to a temporal change of the state to be estimated and estimates a temporal change in the state of the facility.

(Supplementary Note 7)
The state estimation apparatus according to Supplementary Note 4, wherein the second means calculates time-series data of the risk of failure of the facility based on time-series data of the current information of the time interval, performs a filtering process corresponding to the time constant of a temporal change in the state to be estimated on the time-series data of the risk of failure corresponding to the time interval, and estimates a temporal change in the state of the facility.

(Supplementary Note 8)
The state estimation apparatus according to Supplementary Note 1 or 2, wherein the first means uses the current of the facility as the first signal and any one of the power, temperature, humidity, vibration, and atmospheric pressure of the facility as the second signal.

(Supplementary Note 9)
A state estimation method that estimates a state of a facility by a computer, the method comprising:
a first step of extracting a time interval to be analyzed from a time series of a first signal based on a second signal acquired in conjunction with the first signal relating to the operation of the facility; and
a second step of estimating a change in the state of the facility based on waveform data of the selected time interval of the first signal.

(Supplementary Note 10)
The state estimation method according to Supplementary Note 9, comprising:
selecting the time interval of the first signal as an analysis target in the first step when the second signal corresponding to a certain time interval in the time series of the first signal is at a predetermined value or in a predetermined state.

(Supplementary Note 11)
The state estimation method according to Supplementary Note 9, comprising:
excluding a time interval corresponding to an operating mode unaffected by a change in the state of the facility as an analysis target from the time series of the first signal in the first step.

(Supplementary Note 12)
The state estimation method according to Supplementary Note 9 or 10, comprising:
using current and voltage information of the facility as the first and second signals, respectively, and extracting a time interval of the current of the facility operating at the voltage of a specified value or in a specified range in the first step.

(Supplementary Note 13)
The state estimation method according to Supplementary Note 12, wherein the second means estimates a change in the state of the facility from time-series data of the current information of the extracted time interval.

(Supplementary Note 14)
The state estimation method according to Supplementary Note 12, wherein the second step comprises
performing, in the second step, a filtering process corresponding to a temporal change of the state to be estimated and estimating a temporal change in the state of the facility.
(Supplementary Note 15)
The state estimation method according to Supplementary Note 12, wherein the second step comprises:
calculating, in the second step, time-series data of the risk of failure of the facility based on time-series data of the current information of the time interval;
performing a filtering process corresponding to the time constant of a temporal change in a state to be estimated on the time-series data of the risk of failure corresponding to the time interval; and
estimating a temporal change in the state of the facility.
(Supplementary Note 16)
The state estimation method according to Supplementary Note 9 or 10, wherein the first step uses the current of the facility as the first signal and any one of power, temperature, humidity, vibration, and atmospheric pressure of the facility, as the second signal.
(Supplementary Note 17)
A program (recording medium storing the program) causing a computer to execute:
a first process of extracting a time interval to be analyzed from a time series of a first signal based on a second signal acquired in conjunction with the first signal relating to the operation of the facility; and
a second process of estimating a change in the state of the facility based on waveform data of the selected time interval of the first signal.
(Supplementary Note 18)
The program (recording medium) according to Supplementary Note 17, comprising:
selecting the time interval of the first signal as an analysis target in the first process when the second signal corresponding to a certain time interval in the time series of the first signal is at a predetermined value or in a predetermined state.
(Supplementary Note 19)
The program (recording medium) according to Supplementary Note 17, comprising:
excluding a time interval corresponding to an operating mode unaffected by a change in the state of the facility as an analysis target from the time series of the first signal in the first process.
(Supplementary Note 20)
The program (recording medium) according to Supplementary Note 17 or 18, comprising
using current and voltage information of the facility as the first and second signals, respectively; and
extracting a time interval of the current of the facility operating at the voltage of a specified value or in a specified range in the first process.
(Supplementary Note 21)
The program (recording medium) according to Supplementary Note 20, wherein the second process estimates a change in the state of the facility from time-series data of the current information of the extracted time interval.
(Supplementary Note 22)
The program (recording medium) according to Supplementary Note 20, wherein the second process comprises
performing a filtering process corresponding to a temporal change of the state to be estimated and estimating a temporal change in a state of the facility.
(Supplementary Note 23)
The program (recording medium) according to Supplementary Note 20, wherein the second process comprising:
calculating time-series data of a risk of failure of the facility based on time-series data of current information of the time interval; applying a filtering process corresponding to a time constant of a temporal change in a state to be estimated on the time-series data of the risk of failure corresponding to the time interval, and estimating a temporal change in the state of the facility.

The invention claimed is:

1. A state estimation apparatus comprising:
a processor;
a memory storing a program executable by the processor; and
a receiver configured to receive a time series of a first signal relating to an operation of a facility of a monitoring target and a second signal, from a sensor that acquires the first signal and the second signal acquired in conjunction with the first signal,
wherein the processor is configured to:
extract a time interval to be analyzed from the time series of the first signal using the second signal acquired in conjunction with the first signal;
estimate a change in a state of the facility using waveform data of the time interval of the first signal;
using a current and a voltage of the facility as the first and second signals, respectively, extract a time interval of the current of the facility operating at the voltage of a specified value or in a specified range;
calculate time-series data of a risk of failure of the facility, using time-series data of current information in the time interval;
apply a filtering process corresponding to a time constant of a temporal change of the state to be estimated, on the time-series data of the risk of failure corresponding to the time interval;
estimate a temporal change in the state of the facility; and
set a maintenance interval for preventing a failure of the facility based on the estimated temporal change.

2. The state estimation apparatus according to claim 1, wherein the processor is configured to exclude, from an analysis target, a time interval in the time series of the first signal, the time interval corresponding to an operating mode which is unaffected by a change in a state of the facility.

3. A state estimation method that estimates a state of a facility by a computer, the method comprising:
acquiring, by a sensor, a first signal relating to an operation of a facility of a monitoring target and a second signal of the facility in conjunction with the first signal;
obtaining a time series of the first signal and the second signal from the sensor;
extracting a time interval to be analyzed from the time series of the first signal using the second signal acquired in conjunction with the first signal;
estimating a change in a state of the facility using waveform data of the time interval of the first signal;
using a current and a voltage of the facility as the first and second signals, respectively, to extract a time interval of the current of the facility operating at the voltage of a specified value or in a specified range;
calculating time-series data of a risk of failure of the facility, using time-series data of current information in the time interval;
applying a filtering process corresponding to a time constant of a temporal change of the state to be estimated on the time-series data of the risk of failure corresponding to the time interval to estimate a temporal change in the state of the facility; and setting a maintenance interval for preventing a failure of the facility based on the estimated temporal change.

4. The state estimation method according to claim 3, comprising:

excluding, from an analysis target, a time interval in the time series of the first signal, the time interval corresponding to an operating mode which is unaffected by a change in a state of the facility.

5. A non-transitory computer-readable recording medium storing a program, which if executed, causes a computer to execute processing comprising:

obtaining a time series of a first signal relating to an operation of a facility of a monitoring target and a second signal, from a sensor that acquires the first signal and acquires the second signal in conjunction with the first signal;

extracting a time interval to be analyzed from the time series of the first signal using a second signal acquired in conjunction with the first signal;

estimating a change in a state of the facility using waveform data of the time interval of the first signal;

using a current and a voltage of the facility as the first and second signals, respectively, to extract a time interval of the current of the facility operating at the voltage of a specified value or in a specified range;

calculating time-series data of a risk of failure of the facility, using time-series data of current information in the time interval;

applying a filtering process corresponding to a time constant of a temporal change of the state to be estimated on the time-series data of the risk of failure corresponding to the time interval to estimate a temporal change in the state of the facility; and setting a maintenance interval for preventing a failure of the facility based on the estimated temporal change.

6. The non-transitory computer-readable medium according to claim 5, the processing comprising:

excluding, from an analysis target, a time interval in the time series of the first signal, the time interval corresponding to an operating mode which is unaffected by a change in a state of the facility.

7. A state estimation apparatus comprising:

a processor;

a memory storing a program executable by the processor; and a receiver configured to receive, from a sensor, a time series of a power supply voltage applied to a facility and a current flowing through the facility, wherein the processor is configured to:

extract, from the time series of the current, a time interval in which the power supply voltage is at a predetermined value, in a predetermined range, or in a predetermined state;

estimate a state of the facility from current information in the time interval extracted, using a relationship between the current information of the facility and a deterioration degree of the facility including a risk of failure of the facility or a change over time of the facility;

apply a filtering process to the state of the facility estimated from the current information in the time interval to separate and extract a state change of the facility, the filtering process corresponding to a time constant of a temporal change of the state to be estimated; and set a maintenance interval for preventing a failure of the facility based on the estimated temporal change.

* * * * *